US011569340B2

(12) United States Patent
Yun et al.

(10) Patent No.: US 11,569,340 B2
(45) Date of Patent: Jan. 31, 2023

(54) FULLY SYMMETRICAL LATERALLY COUPLED TRANSFORMER FOR SIGNAL AND POWER ISOLATION

(71) Applicant: Analog Devices, Inc., Norwood, MA (US)

(72) Inventors: Ruida Yun, Weston, MA (US); Allison Claudette Lemus, East Cambridge, MA (US)

(73) Assignee: Analog Devices, Inc., Wilmington, MA (US)

( * ) Notice: Subject to any disclaimer, the term of this patent is extended or adjusted under 35 U.S.C. 154(b) by 352 days.

(21) Appl. No.: 16/815,698

(22) Filed: Mar. 11, 2020

(65) Prior Publication Data
US 2020/0295122 A1    Sep. 17, 2020

Related U.S. Application Data

(60) Provisional application No. 62/817,536, filed on Mar. 12, 2019.

(51) Int. Cl.
*H05K 7/00* (2006.01)
*H05K 7/12* (2006.01)
(Continued)

(52) U.S. Cl.
CPC ......... *H01L 28/10* (2013.01); *H01F 27/2804* (2013.01); *H01L 23/645* (2013.01);
(Continued)

(58) Field of Classification Search
CPC ....... H01L 28/10; H01L 23/645; H01L 24/48; H01L 2924/19011; H01L 2924/19042; H01F 27/2804; H01F 2027/2819
(Continued)

(56) References Cited

U.S. PATENT DOCUMENTS 3,785,046 A    1/1974 Jennings
4,500,832 A    2/1985 Mickiewicz
(Continued)

FOREIGN PATENT DOCUMENTS

CN    106710847 B    4/2019
EP    2 656 433 B1    8/2018
(Continued)

OTHER PUBLICATIONS

Chen, Integrated Signal and Power Isolation Provide Robust and Compact Measurement and Control. Analog Devices. Technical Article MS-2511. www.analog.com. 2013; 5 pages.
(Continued)

*Primary Examiner* — Andargie M Aychillhum
(74) *Attorney, Agent, or Firm* — Wolf, Greenfield & Sacks, P.C.

(57) ABSTRACT

Isolators for signals and/or powers transmitted between two circuits configured to operate at different voltage domains are provided. The isolators may have working voltages, for example, higher than 500 Vrms, higher than 1000 Vrms, or between 333 Vrms and 1800 Vrms. The isolators may have a fully symmetrical configuration. The isolators may include a primary winding coupled to a driver and a secondary winding coupled to a receiver. The primary and secondary windings may be laterally coupled to and galvanically isolated from each other. The primary and secondary windings may include concentric traces. The primary and secondary windings may be fabricated using a single metallization layer on a substrate.

20 Claims, 6 Drawing Sheets

(51) Int. Cl.
*H01L 49/02* (2006.01)
*H01L 23/00* (2006.01)
*H01L 25/18* (2006.01)
*H01L 23/64* (2006.01)
*H01F 27/28* (2006.01)

(52) U.S. Cl.
CPC .............. *H01L 24/48* (2013.01); *H01L 25/18* (2013.01); *H01F 2027/2819* (2013.01); *H01L 2224/48091* (2013.01); *H01L 2224/48195* (2013.01); *H01L 2924/19011* (2013.01); *H01L 2924/19042* (2013.01)

(58) Field of Classification Search
USPC ......................................................... 361/767
See application file for complete search history.

(56) References Cited

U.S. PATENT DOCUMENTS

| | | |
|---|---|---|
| 5,451,914 A | 9/1995 | Stengel |
| 5,598,327 A | 1/1997 | Somerville et al. |
| 6,429,763 B1 | 8/2002 | Patel et al. |
| 6,864,777 B2 | 3/2005 | Sigl |
| 6,972,657 B1 | 12/2005 | Pacala et al. |
| 7,171,739 B2 | 2/2007 | Yang et al. |
| 7,915,992 B2 | 3/2011 | de Rooij et al. |
| 7,982,573 B2 | 7/2011 | Mori |
| 8,188,708 B2 | 5/2012 | Altekruse et al. |
| 8,350,659 B2 | 1/2013 | Dziubek et al. |
| 8,884,698 B2 | 11/2014 | Kim et al. |
| 9,049,080 B2 | 6/2015 | Horng et al. |
| 9,312,060 B2 | 4/2016 | Godoy et al. |
| 9,380,705 B2 | 6/2016 | Chen |
| 9,472,329 B2 | 10/2016 | Carsten |
| 9,697,938 B2 | 7/2017 | Yan et al. |
| 9,799,448 B2 | 10/2017 | Wang |
| 10,074,474 B2 | 9/2018 | Harrison |
| 2009/0167476 A1* | 7/2009 | Lee ................... H01F 17/0006 336/200 |
| 2016/0197066 A1* | 7/2016 | Uchida ............ H01L 21/31058 438/3 |
| 2018/0033537 A1* | 2/2018 | Kim ................... H03H 7/0138 |
| 2020/0076512 A1* | 3/2020 | O'Sullivan ........... H01F 27/288 |

FOREIGN PATENT DOCUMENTS

| | | |
|---|---|---|
| JP | H08124760 A | 5/1996 |
| WO | WO 2018/189234 A1 | 10/2018 |
| WO | WO 2019/086853 A1 | 5/2019 |

OTHER PUBLICATIONS

Long, Monolithic Transformers for Silicon RF IC Design. IEEE Journal of Solid-State Circuits. Sep. 2000; 35(9):1368-1382.

* cited by examiner

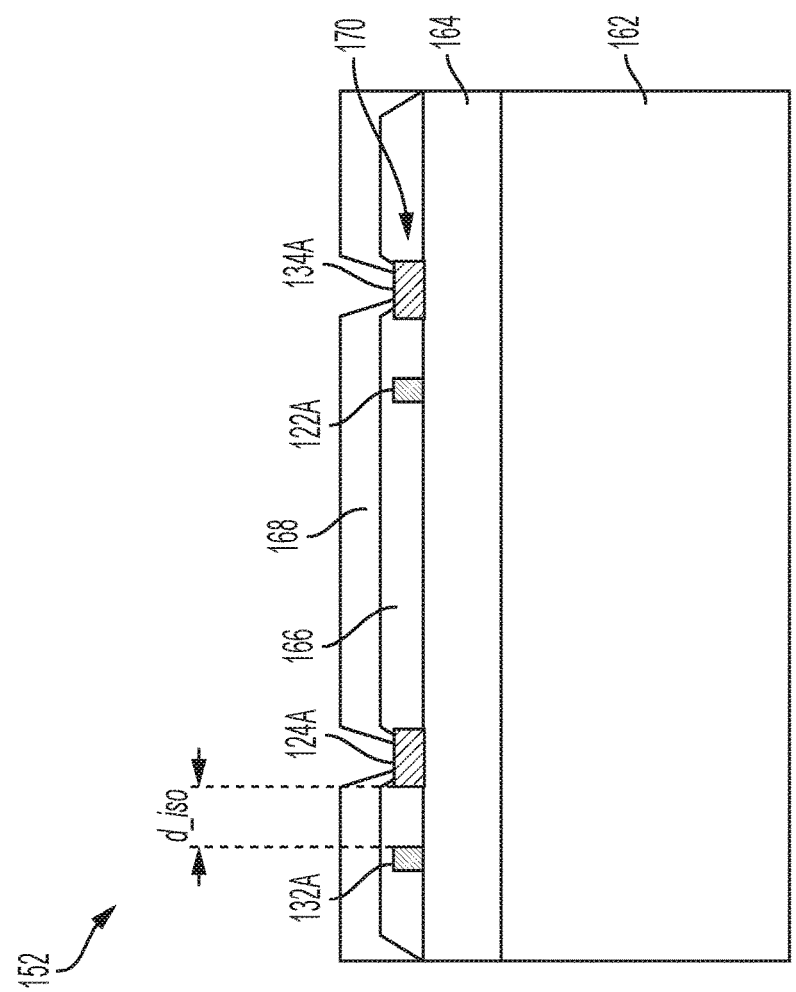
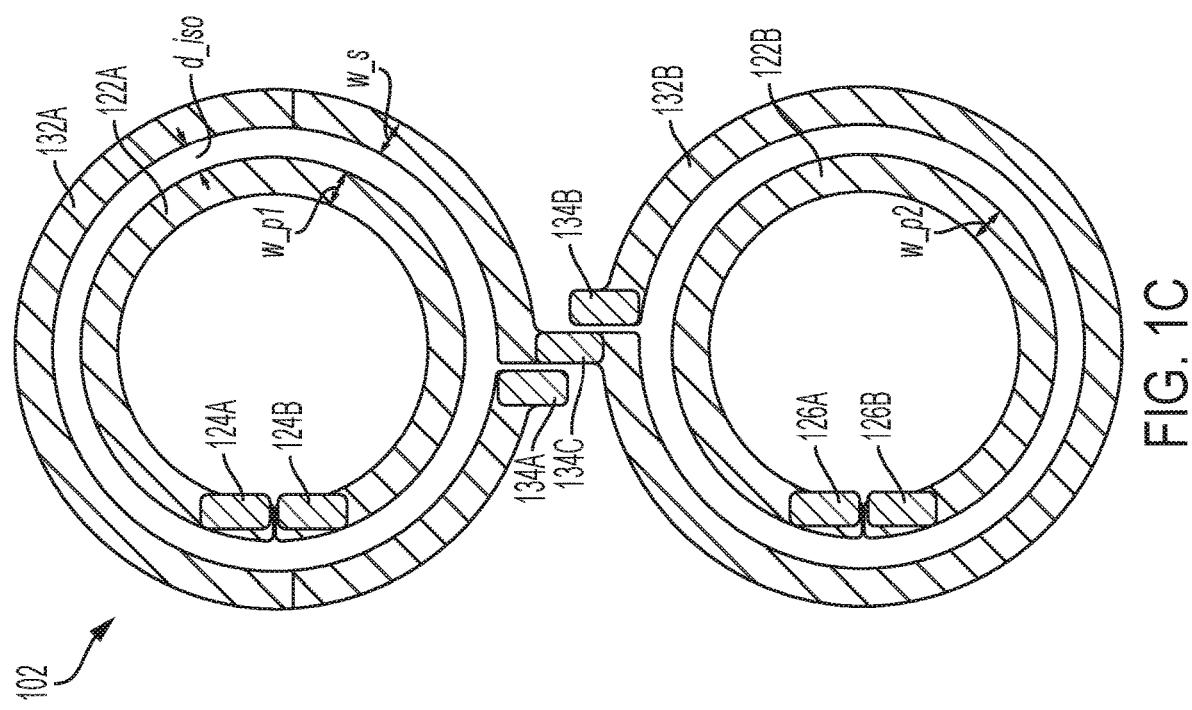
FIG. 1D
FIG. 1C

FULLY SYMMETRICAL LATERALLY COUPLED TRANSFORMER FOR SIGNAL AND POWER ISOLATION

CROSS REFERENCE TO RELATED APPLICATIONS

This patent application claims the benefit of U.S. Provisional Patent Application Ser. No. 62/817,536, filed Mar. 12, 2019, and entitled "FULLY SYMMETRICAL LATERALLY COUPLED TRANSFORMER FOR SIGNAL AND POWER ISOLATION," which is hereby incorporated herein by reference in its entirety.

FIELD OF THE DISCLOSURE

The present application relates to galvanic isolators providing galvanic isolation between circuits.

BACKGROUND

Isolators provide electrical isolation between circuits which communicate with each other. In some situations, circuits which communicate with each other operate at different voltages, for instance one at a relatively high voltage and the other at a relatively low voltage. In some situations, the circuits are referenced to different electrical ground potentials. Isolators can be used to electrically isolate circuits in either of these situations. Connecting multiple isolators in series may increase the amount of isolation between the circuits.

BRIEF SUMMARY

Isolators for signals and/or powers transmitted between two circuits configured to operate at different voltage domains are provided. The isolators may have working voltages, for example, higher than 500 Vrms, higher than 1000 Vrms, or between 333 Vrms and 1800 Vrms. The isolators may have a fully symmetrical configuration. The isolators may include a primary winding coupled to a driver and a secondary winding coupled to a receiver. The primary and secondary windings may be laterally coupled to and galvanically isolated from each other. The primary and secondary windings may include concentric traces. The primary and secondary windings may be fabricated using a single metallization layer on a substrate.

Some embodiments relate to a system comprising an integrated isolator device, a driver, and a receiver. The integrated isolator device comprises a substrate, first and second inductive traces on the substrate and in reflection symmetry with each other, and a third inductive trace on the substrate. The third inductive trace is laterally coupled to and galvanically isolated from the first and second inductive traces. First and second portions of the third inductive trace are concentric to the first and second inductive traces respectively. The driver is configured to operate in a first voltage domain. The driver is coupled to the first and second inductive traces through a first plurality of bonding wires such that the first and second inductive traces have currents flowing in opposite directions. The receiver is configured to operate in a second voltage domain different from the first voltage domain. The receiver is coupled to the third inductive trace through a second plurality of bonding wires such that the first and second portions of the third inductive trace have current flowing in the same directions of the first and second inductive traces respectively.

Some embodiments relate to a system comprising an integrated isolator device, a receiver, and a driver. The integrated isolator device comprises a substrate, first and second inductive traces on the substrate and in reflection symmetry with each other, and a third inductive trace on the substrate. The third inductive trace is laterally coupled to and galvanically isolated from the first and second inductive traces. First and second portions of the third inductive trace are concentric to the first and second inductive traces respectively. The receiver is configured to operate in a first voltage domain. The receiver is coupled to the first and second inductive traces through a first plurality of bonding wires such that the first and second inductive traces have currents flowing in opposite directions. The driver is configured to operate in a second voltage domain different from the first voltage domain. The driver is coupled to the third inductive trace through a second plurality of bonding wires such that the first and second portions of the third inductive trace have current flowing in the same directions of the first and second inductive traces respectively.

Some embodiments relate to a system comprising an integrated isolator device, a transmitter, and a receiver. The integrated isolator device comprises a substrate, first and second inductive traces on the substrate and in reflection symmetry with each other, and a third inductive trace on the substrate. The third inductive trace is laterally coupled to and galvanically isolated from the first and second inductive traces. First and second portions of the third inductive trace are concentric to the first and second inductive traces respectively. The transmitter is configured to operate in a first voltage domain. The transmitter is coupled to the first and second inductive traces through a first plurality of bonding wires such that the first and second inductive traces have currents flowing in opposite directions. The receiver is configured to operate in a second voltage domain different from the first voltage domain. The receiver is coupled to the third inductive trace through a second plurality of bonding wires such that the first and second portions of the third inductive trace have current flowing in the same directions of the first and second inductive traces respectively.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 1C is a layout view of the integrated isolator device of FIG. 1A, according to some embodiments.

FIG. 1D is a simplified cross-sectional view of a transformer die that has the integrated isolator device of FIG. 1A, according to some embodiments.

DETAILED DESCRIPTION

Described herein are isolators capable of operating with high working voltages and high transfer efficiencies. In some embodiments, the isolators may have high working voltages, for example, higher than 500 Vrms, higher than 1000 Vrms, or between 333 Vrms and 1800 Vrms, including any value or range of values within such range. In some embodiments, the isolators may have high transfer efficiencies, for example, between 30% and 90%, including any value or range of values within such range. The inventors have recognized and appreciated that conventional isolators cannot sustain such high working voltages and provide such high transfer efficiencies at the same time. Conventional isolators are fabricated with multiple metallization layers, which are vertically stacked, to improve their transfer efficiencies. However, fitting multiple metallization layers in a fabrication process reduces the distances between adjacent metallization layers. As the distances between adjacent metallization layers determine the thickness of the isolation barriers for the conventional isolators, the working voltages that can be sustained by the conventional isolators are decreased.

Aspects of the present application provide isolator apparatus and methods for operation with high working voltages and high transfer efficiencies. In some embodiments, an integrated isolator device may include a primary winding and a secondary winding laterally coupled to and galvanically isolated from each other. The primary and secondary windings may be fabricated using a single metallization layer on a substrate. The isolation barrier for the isolator device may depend at least in part on the lateral distance between the primary and secondary windings, and be adjustable by varying the lateral distance between the windings. Such lateral configuration provides design flexibility for different applications that employ isolators, and is much less expensive compared to varying vertical distances between metallization layers as a changed fabrication process requires significant time and effort to develop, characterize and qualify.

In some embodiments, an isolator system may have a fully symmetrical configuration, which increases the isolator system's quality factor by improving robustness and reducing radiated emission. The isolator system may include a laterally coupled integrated isolator device having primary and secondary windings. The primary winding of the isolator device may be coupled to a driver through bonding wires such that currents flowing through first and second portions of the primary winding travel substantially similar lengths between respective portions of the primary winding and the driver. The secondary winding of the isolator device may be coupled to a receiver though bonding wires such that currents flowing through first and second portions of the secondary winding travel substantially similar lengths between respective portions of the secondary winding and the receiver.

Figure 1A:
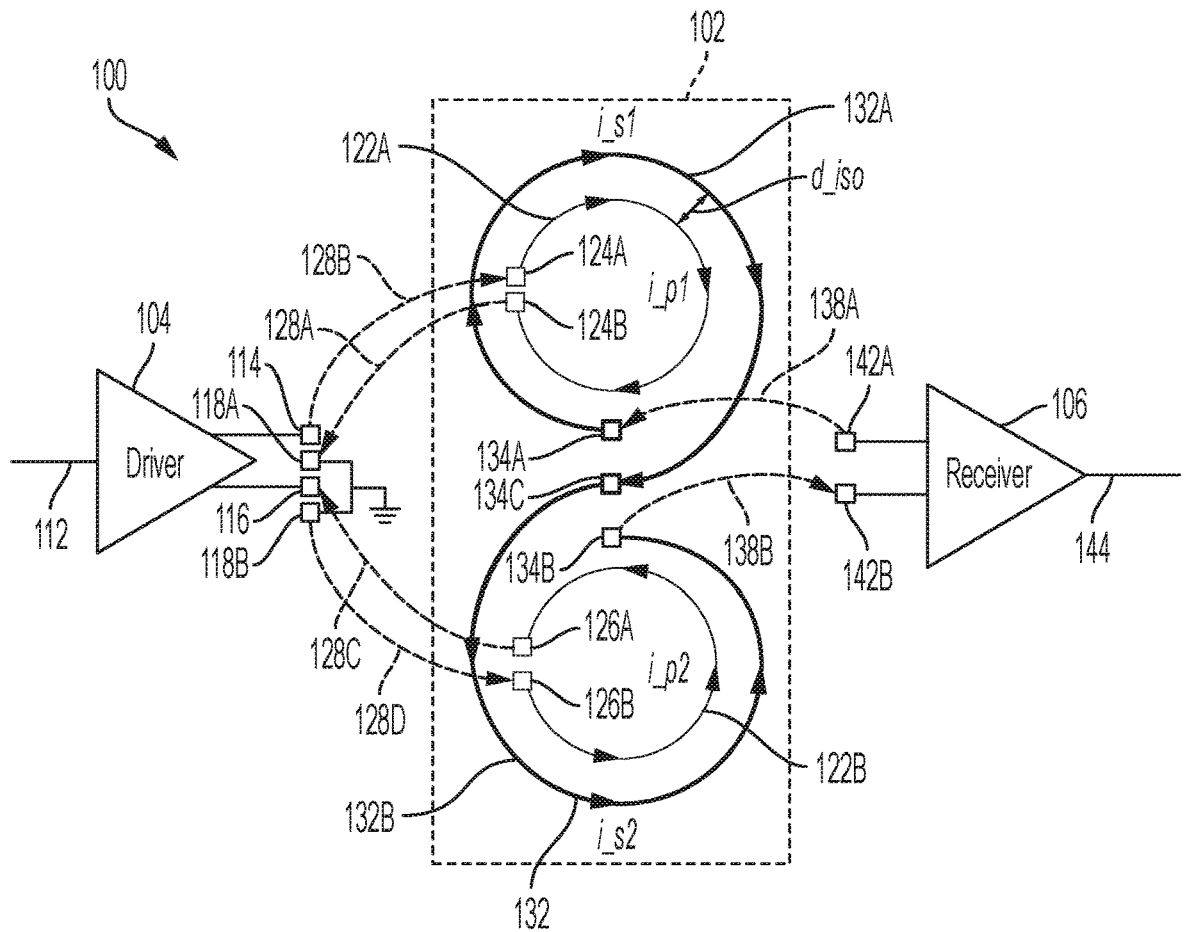
FIG. 1A is a simplified schematic of a system including an integrated isolator device, illustrating physical connections among components of the system, according to some embodiments.
Figure 1B:
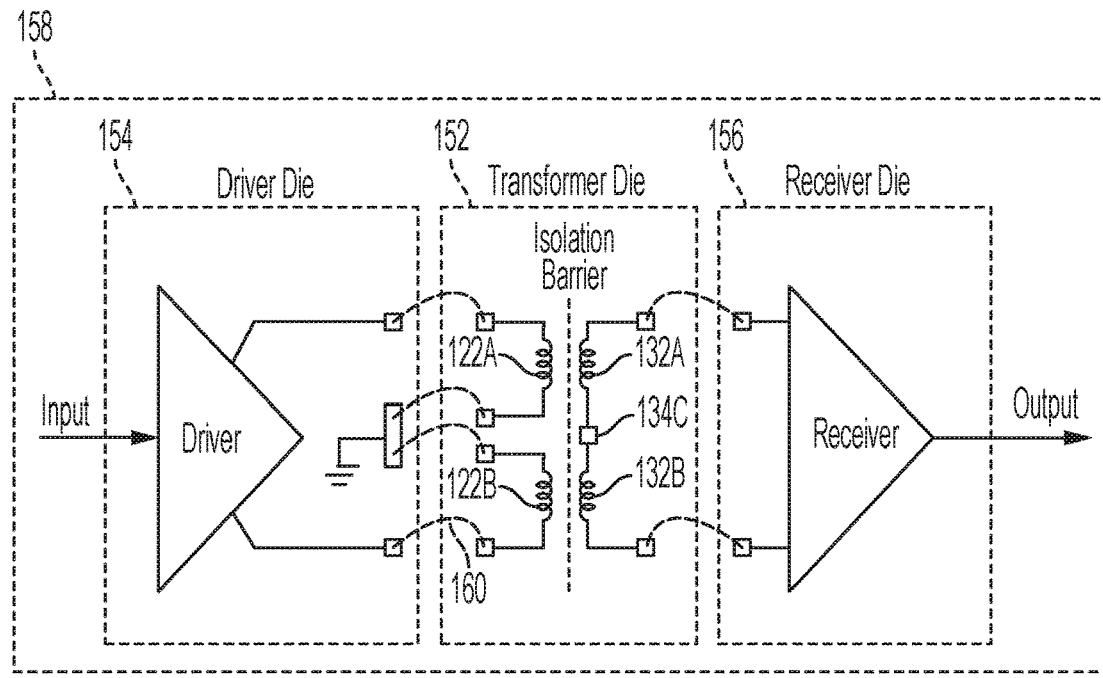
FIG. 1B is a simplified schematic view of the system with an equivalent circuit of the integrated isolator device of FIG. 1A, according to some embodiments.

An example of such an isolator system is shown in FIGS. 1A-1D. FIG. 1A is a simplified schematic of a system 100, according to some embodiments. The system may include an integrated isolator device 102. The integrated isolator device 102 may provide galvanic isolation between a driver 104 and a receiver 106, which may operate at different voltage domains corresponding to, for example, different supply voltages and/or different reference voltages. FIG. 1B is a simplified schematic view of the system 100 with an equivalent circuit of the integrated isolator device 102, according to some embodiments. FIG. 1C is a layout view of the integrated isolator device 102, according to some embodiments. FIG. 1D is a simplified cross-sectional view of a transformer die 152 that has the integrated isolator device 102, according to some embodiments.

The integrated isolator device 102 may include a primary winding and a secondary winding laterally coupled to and galvanically isolated from each other. The primary winding may include four bonding pads 124A, 124B, 126A and 126B, a first inductive trace 122A extending between the bonding pads 124A and 124B, and a second inductive trace 122B extending between the bonding pads 126A and 126B. The first and second inductive traces 122A and 122B may be in reflection symmetry with each other such that the first and second inductive traces 122A and 122B can be coupled to the driver 104 with bonding wires 128A, 128B, 128C and 128D that extend in substantially similar lengths.

The driver 104 may receive an input 112 and provide outputs to two bonding pads 114 and 116. The driver 104 may also include two ground bonding pads 118A and 118B. It should be appreciated that the ground bonding pads 118A and 118B need not be connected to earth ground, but are configured to carry reference potentials, which may include earth ground, DC voltages, or other suitable reference potentials.

The primary winding may include a center tap, which may be formed by using bonding wires to connect the bonding pads 124B and 126B of the primary winding to the ground bonding pads 118A and 118B respectively. A first bonding wire 128A may connect the output bonding pad 114 of the driver 104 to the bonding pad 124A of the first trace 122A. A second bonding wire 128B may connect the ground bonding pad 118A of the driver 104 to the bonding pad 124B of the first trace 122A. A third bonding wire 128C may connect the output bonding pad 116 of the driver 104 to the bonding pad 126A of the second trace 122B. A fourth bonding wire 128D may connect the ground bonding pad 118B of the driver 104 to the bonding pad 126B of the second trace 122B. Such configuration enables that the first and second inductive traces have currents i_p1 and i_p2 flowing in opposite directions, which cancels far field radiation and thus increases the isolator device's quality factor. It should be appreciated that although the example illustrates a driver, which may be used in a power isolator, the primary winding may be coupled to a transmitter, which may be used in a signal isolator.

The secondary winding of the isolator device may include two bonding pads 134A and 134B, a third inductive trace 132 extending between the bonding pads 134A and 134B, and a center tap, which may be in the form of a bonding pad 134C. The third inductive trace 132 may include a first portion 132A extending between the bonding pads 134A and 134C, and a second portion 132B extending between the bonding pads 134B and 134C. The first and second portions 132A and 132B of the third inductive trace 132 may be substantially concentric to the first and second inductive traces 122A and 122B of the primary winding, respectively, which may increase the coupling coefficient between the primary and secondary windings. The first and second portions 132A and 132B of the third inductive trace 132 may be in rotational symmetry with each other such that the first and second portions 132A and 132B can be coupled to the receiver 106 with bonding wires 142A and 142B that extend in substantially similar lengths. In some embodiments, the secondary winding may be S-shaped, or any suitable shape.

The receiver 106 may receive inputs from bonding pads 142A and 142B and provide an output 144. A first bonding wire 142A may connect the input bonding pad 142A of the receiver 106 to the bonding pad 134A of the secondary winding. A second bonding wire 142B may connect the input bonding pad 142B of the receiver 106 to the bonding pad 134B of the secondary winding. Such configuration enables that the first and second portions 132A and 132B of the third inductive trace 132 have currents i_s1 and i_s2 flowing in the same directions of the currents i_p1 and i_p2 flowing in the first and second inductive traces 122A and 122B of the primary winding, respectively.

A thickness of the isolation barrier for the isolator device 102 may depend at least in part on the lateral distance between the primary and secondary windings. In the illustrated example, the primary and secondary windings are laterally spaced from each other by a distance d_iso, which may be a distance between an outer boundary of the primary winding and an inner boundary of the secondary winding. This distance d_iso may be varied simply by varying layout design.

In some embodiments, the system 100 may be formed on a printed circuit board 158. As illustrated in FIG. 1B, which is a simplified schematic view of the system 100 with an equivalent circuits, the system 100 may include the transformer die 152 that includes the isolator device 102, a driver die 154 that includes the driver 104, and a receiver die 156 that includes the receiver 106. In some embodiments, the dies 152, 154 and 156 may be separately manufactured, and mounted on the printed circuit board 158. Interconnections between any two of the dies 152, 154 and 156 may be formed by, for example, bond wires 160, solder balls, and/or one or more of PCB metallization layers. In some embodiments, any components on the dies 152, 154 and 156 may be integrally formed on a single die.

In the layout illustrated in FIG. 1C, the first, second, and third inductive traces 122A, 122B, and 132 have widths w_p1, w_p2, w_2, respectively. In some embodiments, any one of the widths may be in the range of 20 μm to 200 μm, including any value or range of values within such range. In some embodiments, the inductive traces may have a same width. In some embodiments, the inductive traces may have different width. For example, since the S-shaped winding may be longer, the S-shaped winding may be configured to have a greater width to reduce its resistance.

In the simplified cross-sectional view of the transformer die 152 illustrated in FIG. 1C, the primary and secondary windings of the isolator device 102 may be formed on a substrate 162. In some embodiments, the isolator device 102 may be further separated from the substrate by an isolation layer 164.

The primary and secondary windings of the isolator device 102 may be formed in a single metallization layer 170 on the substrate 162. The edges of the windings may have a higher likelihood to break down because of the large voltage difference. To reduce the risk of undesired break down, the primary and secondary windings of the isolator device 102 may be encapsulated by an insulating layer 168, which may have high permittivity, for example, silicon nitride (SiN), aluminum oxide ($Al_2O_3$), tantalum pentoxide ($Ta_2O_5$), strontium titanate ($SrTiO_3$), bismuth ferrite ($BiFeO_3$), silicon dioxide ($SiO_2$), and barium strontium titinate (BST). The insulating layer 168 may have a thickness in the range of 50 nm to 500 nm, in the range of 50 nm to 200 nm, including any value or range of values within such range.

Figure 2B:
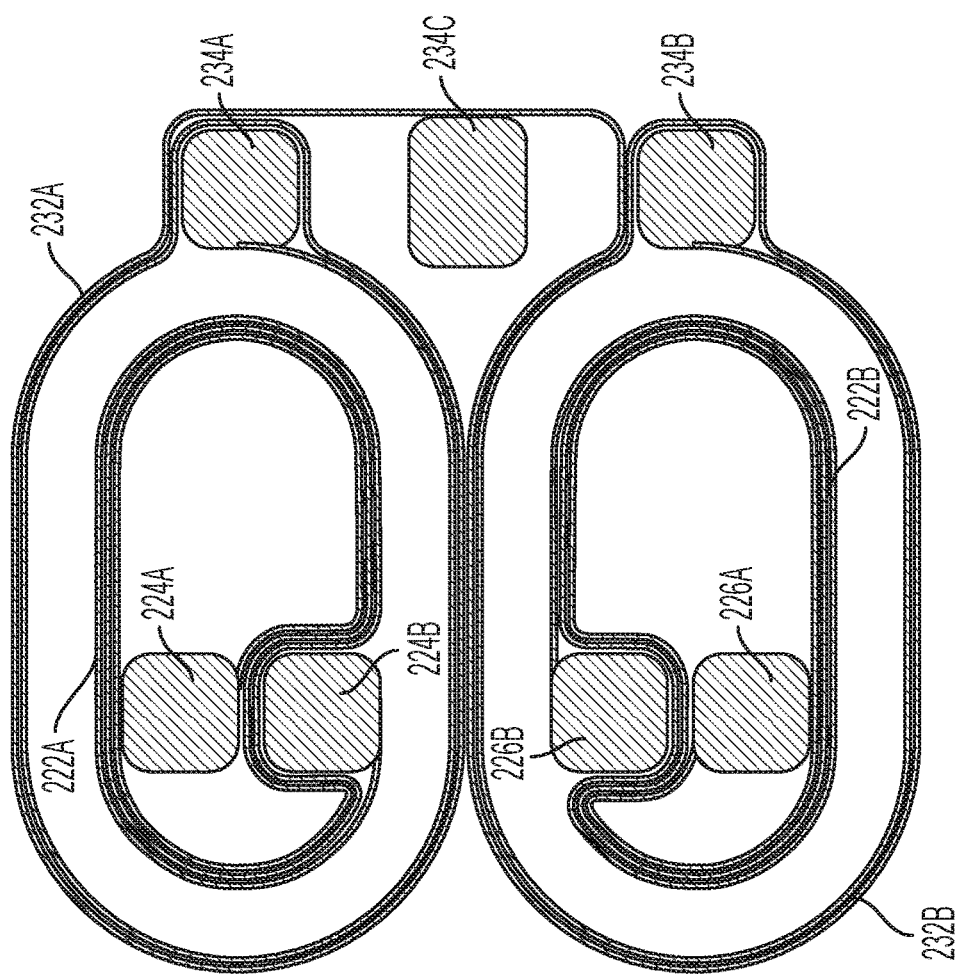
FIG. 2B is a layout view of the integrated isolator device of FIG. 2A, according to some embodiments.
Figure 2A:
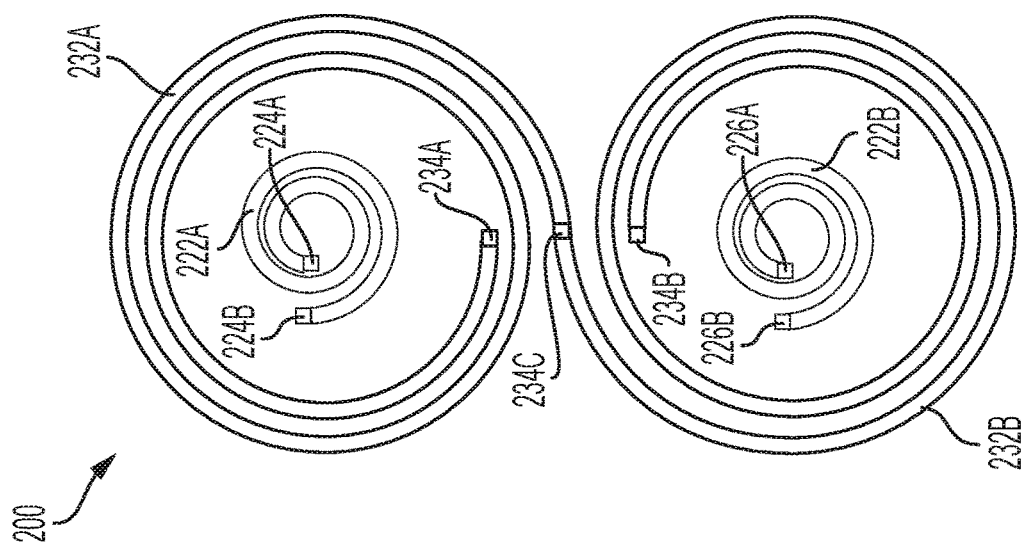
FIG. 2A is a simplified schematic view of a first alternative embodiment of the integrated isolator device of FIG. 1A, according to some embodiments.

Alternative embodiments for an integrated isolator device are shown in FIGS. 2A-5. The primary and secondary windings of an integrated isolator device may have one or more loops. FIG. 2A is a simplified schematic view of an integrated isolator device 200 that has primary and secondary windings with multiple loops, according to some embodiments. The primary winding of the isolator device 200 may include a first inductive trace 222A extending between bonding pads 224A and 224B, and a second inductive trace 222B extending between bonding pads 226A and 226B. The secondary winding of the isolator device 200 may include a third inductive trace extending between bonding pads 234A and 234B, and a center tap 234C. The inductive traces may have any suitable shape including, for example, substantially in circles as illustrated in FIG. 1C, and substantially in ovals as illustrated in FIG. 2B, which is a layout view of the integrated isolator device 200, according to some embodiments.

As discussed above, the S-shaped winding 132 may have a slightly greater inductance than the combination of the separated inductive traces 122A and 122B because it may extend longer. When the S-shaped winding 132 has a greater inductance, the winding 132 may be coupled to the receiver because the winding 132 may step up signal and/or power transmitted from the first and second inductive traces 122A and 122B. The amplification provided by the secondary winding may reduce the power needed to drive the primary winding.

Figure 3:
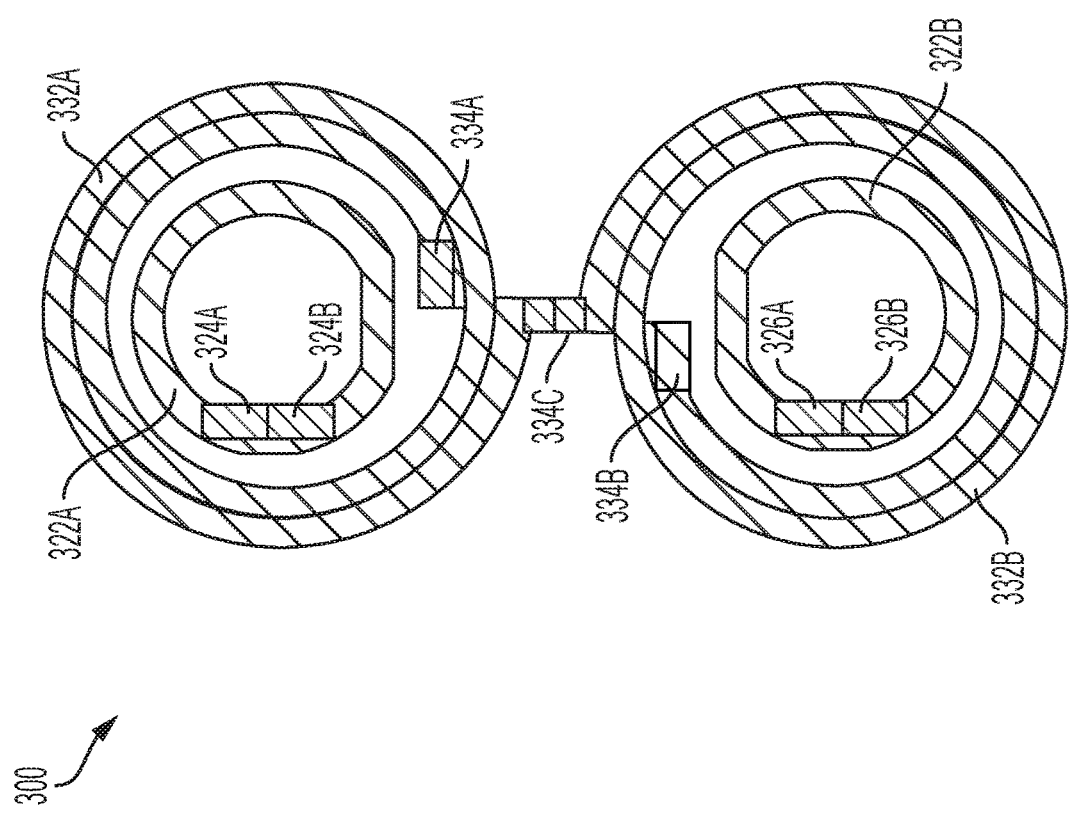
FIG. 3 is a layout view of a second alternative embodiment of the integrated isolator device of FIG. 1A, according to some embodiments.

In some embodiments, the power amplification induced by the S-shaped inductive trace may be enhanced by including more loops in the S-shaped inductive trace. FIG. 3 is a layout view of an integrated isolator device 300, according to some embodiments. The primary winding of the isolator device 300 may include a first inductive trace 322A extending between bonding pads 324A and 324B, and a second inductive trace 322B extending between bonding pads 326A and 326B. In the illustrated example, each of the first and second inductive traces 322A and 322B has one loop. The second winding of the isolator device 300 may include a third inductive trace extending between bonding pads 334A and 334B, and a center tap 334C. In the illustrated example, the third inductive trace has multiple loops.

Figure 4:
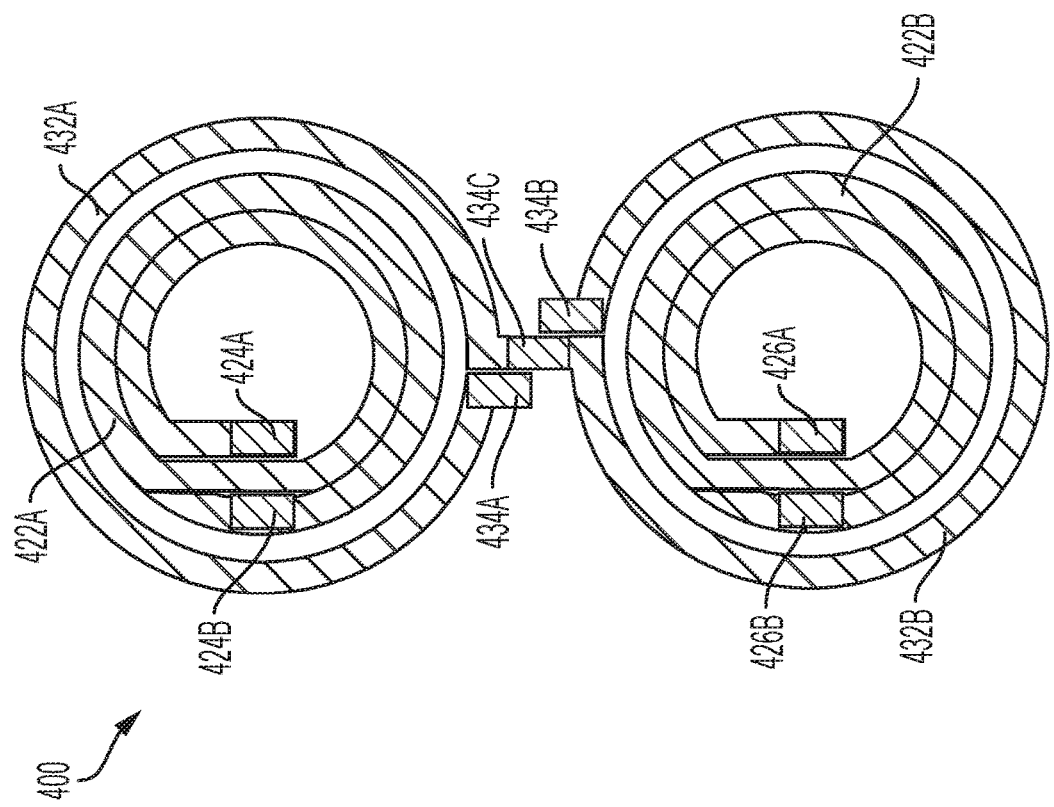
FIG. 4 is a layout view of a third alternative embodiment of the integrated isolator device of FIG. 1A, according to some embodiments.

It should be appreciated either the separated inductive traces or the S-shaped inductive trace can be the primary winding. In some embodiments, the separated inductive traces may be configured to have greater inductance than the S-shaped inductive trace by, for example, making the separated inductive traces have more loops. FIG. 4 is a layout view of an integrated isolator device 400, according to some embodiments. The primary winding of the isolator device 400 may include a first inductive trace 422A extending between bonding pads 424A and 424B, and a second inductive trace 422B extending between bonding pads 426A and 426B. In the illustrated example, each of the first and second inductive traces 322A and 322B has multiple loops. The second winding of the isolator device 400 may include a third inductive trace extending between bonding pads 434A and 434B, and a center tap 434C. In the illustrated example, the third inductive trace has one loop.

Figure 5:
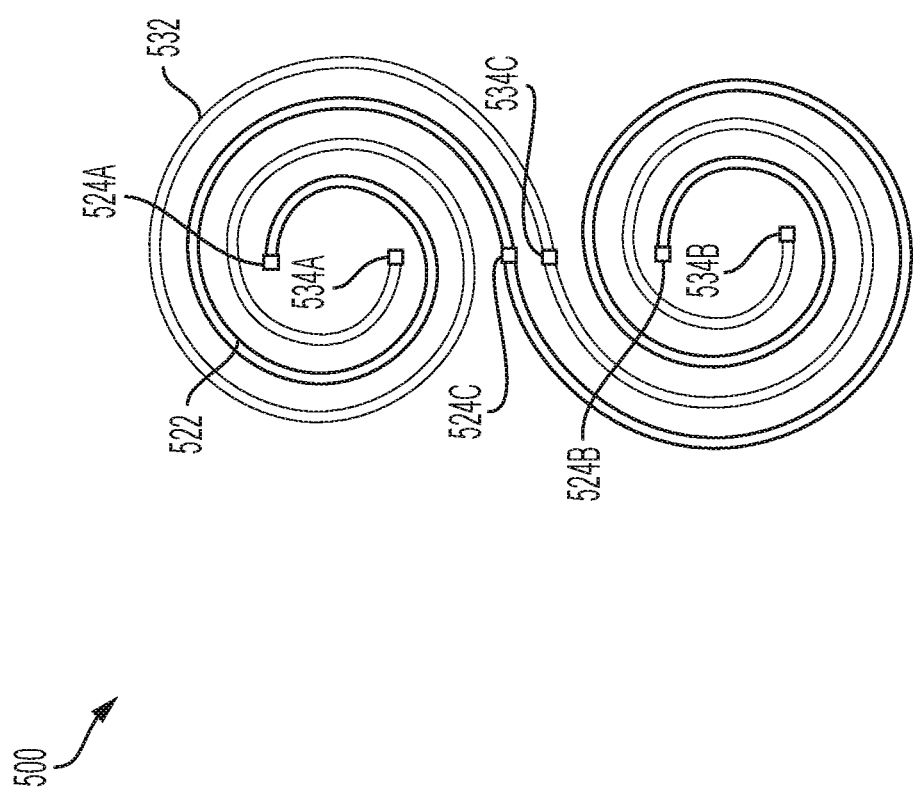
FIG. 5 is a simplified schematic view of a fourth alternative embodiment of the integrated isolator device of FIG. 1A, according to some embodiments.

In some embodiments, an isolator device may have interleaved primary and secondary windings. FIG. 5 is a simplified schematic view of an integrated isolator device 500, according to some embodiments. The isolator device 500 may include a primary winding 522 extending between bonding pads 524A and 524B, and a secondary winding 532 extending between bonding pads 534A and 534B. In the illustrated example, the primary and secondary windings 522 and 532 are interleaved, and each has a center tap 524C and 534C.

Figure 6:
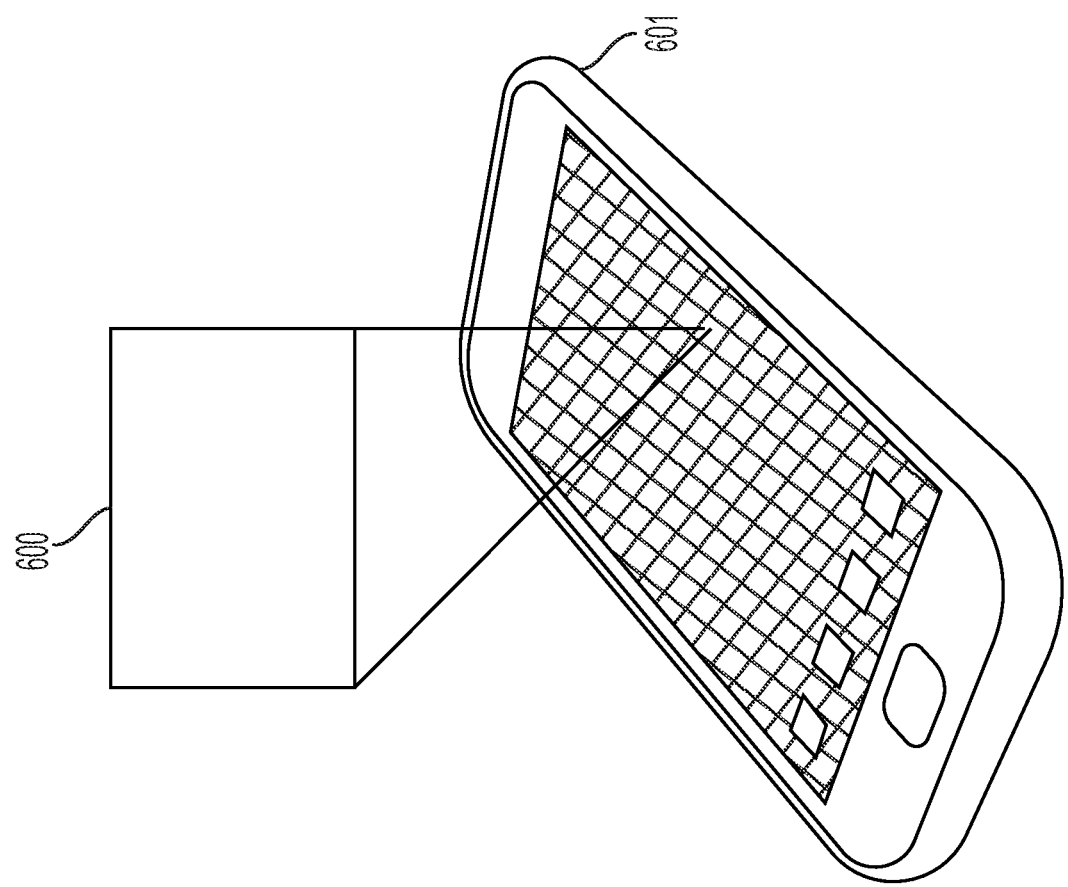
FIG. 6 is a schematic diagram illustrating a portable electronic device incorporating a system including an integrated isolator device, according to some embodiments.

Integrated isolator devices of the types described herein may be used in various devices and settings. For example, the integrated isolator devices may be used for isolation in medical equipment systems, industrial equipment systems, physical measurement systems, or personal or portable electronic equipment. FIG. 6 is a schematic diagram showing a non-limiting application of an integrated isolator system in a portable electronic device setting, according to some embodiments. An integrated isolator system 600 may be used in a portable electronic device 601 to transmit signals and/or power across an isolation barrier with both high working voltages and high transfer efficiencies. The portable electronic device 601 may be a smartphone, personal digital assistant (PDA), tablet or other portable device. Other such devices may make use of integrated isolator systems of the types described herein.

While FIG. 6 illustrates an example of a portable electronic device 601 incorporating aspects of the present application, other uses are possible. For example, one or more integrated isolator systems 600 may be employed in an automobile or a medical instrument. Various embodiments of the present application may be implemented to provide high transfer efficiencies and high working voltages.

Examples of conductive materials that may be used to form components (e.g., inductive traces, bonding wires) in embodiments of the isolator system described herein include gold and copper, or any other suitable conductive material.

The integrated isolator devices described herein may be used in various applications (e.g., industrial, medical, consumer). For example, data transfer and/or power transfer between galvanically isolated systems may be accomplished with the integrated isolator devices described herein. As one example, medical equipment in a room in which a medical procedure is being performed may be galvanically isolated from a control system in a control room. For instance, a piece of medical imaging equipment and/or monitors in the room in which the procedure is being performed may be isolated from a system controlling operation of the imaging equipment and/or display. The isolator may be an integrated isolator device and/or system of any of the types described herein, and the isolated signal path may be analog or digital.

As another example, industrial equipment may be isolated from a control system controlling the equipment. For example, high wattage motors may be isolated from control systems controlling their operation by integrated isolator device of the types described herein. The control systems may operate at a lower wattage than the high wattage motors used by the industrial equipment. The isolator may be disposed on a circuit board on which various circuit components connected to the motors and/or control equipment are included.

Other uses of the integrated isolator devices described herein are also possible, as those examples described are non-limiting.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A system comprising:
an integrated isolator device comprising:
    a substrate,
    first and second inductive traces on the substrate and in reflection symmetry with each other, and
    a third inductive trace on the substrate, the third inductive trace being laterally coupled to and galvanically isolated from the first and second inductive traces, first and second portions of the third inductive trace being concentric to the first and second inductive traces respectively;
a driver configured to operate in a first voltage domain, the driver being coupled to the first and second inductive traces through a first plurality of bonding wires such that the first and second inductive traces have currents flowing in opposite directions; and
a receiver configured to operate in a second voltage domain different from the first voltage domain, the receiver being coupled to the third inductive trace through a second plurality of bonding wires such that the first and second portions of the third inductive trace have current flowing in the same directions of the first and second inductive traces respectively.

2. The integrated isolator device of claim 1, wherein:
The first and second portions of the third inductive trace are separated from the first and second inductive traces respectively such that the driver and the receiver can operate in voltage domains with a difference higher than 1000 Vrms.

3. The system of claim 1, wherein the first and second inductive traces are in a same metallization layer.

4. The system of claim 3, wherein the third inductive trace is in the same metallization layer as the first and second inductive traces.

5. The system of claim 1, wherein the third inductive trace is S-shaped.

6. The system of claim 1, wherein the third inductive trace has a width larger than the first and second conductive traces.

7. The system of claim 1, wherein:
the first inductive trace comprises a first number of loops,
the first portion of the third inductive trace comprises a second number of loops, and
the first number is larger than the second number.

8. The system of claim 1, wherein:
the first inductive trace comprises a first number of loops,
the first portion of the third inductive trace comprises a second number of loops, and
the first number is smaller than the second number.

9. The system of claim 1, wherein the third inductive trace has a center-tap.

10. The system of claim 1, further comprising:
a printed circuit board, wherein the driver is an integrated circuit chip mounted on the printed circuit board.

11. A system comprising:
an integrated isolator device comprising:
    a substrate,
    first and second inductive traces on the substrate and in reflection symmetry with each other, and a third inductive trace on the substrate, the third inductive trace being laterally coupled to and galvanically isolated from the first and second inductive traces, first and second portions of the third inductive trace being concentric to the first and second inductive traces respectively;

a receiver configured to operate in a first voltage domain, the transmitter being coupled to the first and second inductive traces through a first plurality of bonding wires such that the first and second inductive traces have currents flowing in opposite directions; and a driver configured to operate in a second voltage domain different from the first voltage domain, the receiver being coupled to the third inductive trace through a second plurality of bonding wires such that the first and second portions of the third inductive trace have current flowing in the same directions of the first and second inductive traces respectively.

12. The integrated isolator device of claim 11, wherein:
The first and second portions of the third inductive trace are separated from the first and second inductive traces respectively such that the driver and the receiver can operate in voltage domains with a difference higher than 1000 Vrms.

13. The system of claim 11, wherein the first and second inductive traces are in a same metallization layer.

14. The system of claim 13, wherein the third inductive trace is in the same metallization layer as the first and second inductive traces.

15. The system of claim 11, wherein the third inductive trace is S-shaped.

16. The system of claim 11, wherein the third inductive trace has a width larger than the first and second conductive traces.

17. The system of claim 11, wherein:
the first inductive trace comprises a first number of loops,
the first portion of the third inductive trace comprises a second number of loops, and
the first number is larger than the second number.

18. The system of claim 11, wherein:
the first inductive trace comprises a first number of loops,
the first portion of the third inductive trace comprises a second number of loops, and
the first number is smaller than the second number.

19. The system of claim 11, wherein the third inductive trace has a center-tap.

20. A system comprising:
an integrated isolator device comprising:
a substrate,
first and second inductive traces on the substrate and in reflection symmetry with each other, and
a third inductive trace on the substrate, the third inductive trace being laterally coupled to and galvanically isolated from the first and second inductive traces, first and second portions of the third inductive trace being concentric to the first and second inductive traces respectively;
a transmitter configured to operate in a first voltage domain, the transmitter being coupled to the first and second inductive traces through a first plurality of bonding wires such that the first and second inductive traces have currents flowing in opposite directions; and
a receiver configured to operate in a second voltage domain different from the first voltage domain, the receiver being coupled to the third inductive trace through a second plurality of bonding wires such that the first and second portions of the third inductive trace have current flowing in the same directions of the first and second inductive traces respectively.

\* \* \* \* \*